United States Patent
Lee

(10) Patent No.: US 6,812,085 B2
(45) Date of Patent: Nov. 2, 2004

(54) SEMICONDUCTOR DEVICE AND METHOD FOR FABRICATING SAME

(75) Inventor: Sang Gi Lee, Chungcheongbuk-do (KR)

(73) Assignee: Hynix Semiconductor Inc, Ichon-shi (KR)

(*) Notice: Subject to any disclaimer, the term of this patent is extended or adjusted under 35 U.S.C. 154(b) by 0 days.

(21) Appl. No.: 10/271,745

(22) Filed: Oct. 17, 2002

(65) Prior Publication Data

US 2003/0040151 A1 Feb. 27, 2003

Related U.S. Application Data

(62) Division of application No. 09/722,037, filed on Nov. 27, 2000, now Pat. No. 6,498,379.

(30) Foreign Application Priority Data

Jul. 19, 2000 (KR) ........................................ 2000-41369

(51) Int. Cl.$^7$ ........................................... H01L 21/8238
(52) U.S. Cl. ...................... 438/230; 438/197; 438/231; 438/303; 438/305; 438/275; 438/276; 438/587
(58) Field of Search .................................. 438/197, 230, 438/231, 232, 301, 303, 305, 306, 270, 271, 275, 276, 289, 585, 587, 588, 592; 257/412

(56) References Cited

U.S. PATENT DOCUMENTS

| 5,514,611 | A | * | 5/1996 | Kim et al. | 438/275 |
| 5,696,012 | A | * | 12/1997 | Son | 438/231 |
| 5,777,920 | A | | 7/1998 | Ishigaki et al. | 365/154 |
| 5,817,563 | A | | 10/1998 | Lim | 438/307 |
| 5,949,110 | A | | 9/1999 | Arima | 257/368 |
| 5,969,395 | A | | 10/1999 | Lee | 257/408 |
| 6,171,891 | B1 | * | 1/2001 | Lee et al. | 438/197 |
| 6,255,705 | B1 | | 7/2001 | Zhang et al. | 257/412 |

* cited by examiner

Primary Examiner—Maria Guerrero
(74) Attorney, Agent, or Firm—Jacobson Holman PLLC

(57) ABSTRACT

A semiconductor device and a method for fabricating the same which improve characteristic of stand-by current of an SRAM cell is disclosed in the present invention. The semiconductor device comprises a semiconductor substrate in which a peripheral area and a cell area are defined, a first and second gate insulating layers on the semiconductor substrate of the peripheral area and the cell area, first and second gate electrodes on the first and second gate insulating layers, respectively, first and second heavily doped source/drain regions in the semiconductor substrate at both sides of the first gate electrode and the second gate electrode, respectively, first and second lightly doped source/drain regions in the semiconductor substrate, adjacent to the first heavily doped source/drain regions and the second heavily doped source/drain regions, respectively, wherein the first and second lightly doped source/drain regions have a different length, and a silicide layer on the first and second gate electrodes and in the first and second heavily doped source/drain regions.

17 Claims, 7 Drawing Sheets

SEMICONDUCTOR DEVICE AND METHOD FOR FABRICATING SAME

This is a divisional of application Ser. No. 09/722,037 filed on Nov. 27, 2000 now U.S. Pat. No. 6,498,379.

This application claims the benefit of Korean Application No. P2000-41369 filed Jul. 19, 2000, which is hereby incorporated by reference.

BACKGROUND OF THE INVENTION

1. Field of the Invention

The present invention relates to a semiconductor device, and more particularly, to a semiconductor device and a method for fabricating the same which improve the characteristic of stand-by current of an SRAM cell.

2. Background of the Related Art

A related art semiconductor device and method for fabricating the same will be described with the accompanying drawings.

FIG. 1 is a cross-sectional view showing a related art semiconductor device, and FIGS. 2A to 2D are cross-sectional views showing fabricating process steps of the related art semiconductor device. In the drawings, left sides are cross-sectional views of a transistor formed in a peripheral area of an SRAM while right sides are cross-sectional views of a transistor formed in a cell area of the SRAM.

As shown in FIG. 1, a cell area and a peripheral area of the SRAM are defined in a semiconductor substrate 101. A gate electrode 103 is formed on the semiconductor substrate 101, and a gate oxide film 102 is interposed between the semiconductor 101 and the gate electrode 103. In both the cell area and the peripheral area, heavily doped source/drain regions 106 are formed in the semiconductor substrate 101 at predetermined depths with the same distance from the gate electrode 103. Subsequently, lightly doped source/drain regions 110 are formed in the semiconductor substrate 101 between the gate electrode 103 and the heavily doped source/drain regions 106 at predetermined depths.

The lightly doped source/drain regions 110 of the peripheral area and the cell area are formed with the same length as shown in portions A and B of FIG. 1.

Afterwards, a cobalt silicide layer 109 is formed on surfaces of the gate electrode 103 and the heavily doped source/drain regions 106.

Now, a method for fabricating the aforementioned related art semiconductor device will be described with reference to FIGS. 2A to 2D.

The transistor of the cell area and the transistor of the peripheral area are formed at the same time.

As shown in FIG. 2A, the cell area and the peripheral area are defined in the semiconductor substrate 101 and the gate oxide film 102 is formed on the entire surface of the semiconductor substrate 101. Then, a polysilicon layer for gate electrode is deposited on the gate oxide film 102.

Afterwards, the polysilicon layer and the gate oxide film 102 are selectively removed by photolithography and etching processes to form the gate electrode 103 on the semiconductor substrate 101 of the cell area and the peripheral area.

A titanium nitride(TiN) layer is then deposited along the surfaces of the gate electrode 103 and the semiconductor substrate 101 by chemical vapor deposition (CVD). A silicon oxide ($SiO_2$) layer is deposited on the TiN layer.

The silicon oxide layer and the TiN layer are etched back to remain on both sides of the gate oxide film 102 and the gate electrode 103 as well as on the semiconductor substrate 101 adjacent to both sides, so that a nitride film spacer 104 and an insulating spacer 105 are formed thereon.

As shown in FIG. 2B, the insulating spacer 105 is removed, and then heavily doped impurity ions are injected into the entire surface of the semiconductor substrate 101 using the nitride film spacer 104 as a mask, so that the heavily doped source/drain regions 106 are formed in the semiconductor substrate 101 at both sides of the gate electrode 103 and the nitride film spacer 104 at predetermined depths.

As shown in FIG. 2C, a cobalt layer 107 and a TiN layer 108 are sequentially deposited on the entire surface of the semiconductor substrate 101 including the gate electrode 103. At this time, instead of Co of the cobalt layer 107, any one of refractory metals such as W, Ti and Mo may be used.

As shown in FIG. 2D, a cobalt silicide layer 109 is formed on the surfaces of the heavily doped source/drain regions 106 and the gate electrode 103 by a rapid thermal annealing (RTA) process. The cobalt silicide layer 109 includes a cobalt silicide which is a material obtained by reacting silicon of the heavily doped source/drain regions 106 and the gate electrode 103 with cobalt of the cobalt layer 107.

Afterwards, the TiN layer and the cobalt layer 107 which remain without reacting with silicon are removed and then a secondary RTA process is performed for stabilization of the cobalt silicide layer 109.

The nitride film spacer 104 is then removed. Subsequently, as shown in portions A and B of FIG. 2D, the lightly doped source/drain regions 110 having the same length in the peripheral area and the cell area are formed in the semiconductor substrate 101 in which the cobalt silicide layer 109 is not formed, at both sides of the gate electrode 103 by injecting lightly doped impurity ions using the cobalt silicide layer 109 as a mask. Thus, the related art semiconductor device is completed.

However, the related art semiconductor device and method for fabricating the same the following problems.

Since the distance between the gate electrode and the heavily doped source/drain regions formed in the cell area is equal to the distance between the gate electrode and the heavily doped source drain regions formed in the peripheral area, it is difficult to reduce lateral field of the transistor of the cell area. This results in leakage of stand-by current such as gate induced drain leakage (GIDL) when the SRAM cell is not operating.

SUMMARY OF THE INVENTION

An object of the invention is to solve at least the above problems and/or disadvantages and to provide at least the advantages described hereinafter.

Another object of the present invention is to provide a semiconductor device and a method for fabricating the same that substantially obviate one or more of the problems due to limitations and disadvantages of the related art.

Another object of the present invention is to provide a semiconductor device and a method for fabricating the same which improve characteristic of stand-by current of an SRAM cell.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve at least these objects and other advantages in a whole or in part and in accordance with purposes of the present invention, as embodied and broadly described, a semiconductor device according to the present invention comprises a semiconductor substrate in which a peripheral area and a cell area are defined, a first and second gate insulating layers on the semiconductor substrate of the peripheral area and the cell area, first and second gate electrodes on the first and second gate insulating layers, respectively, first and second heavily doped source/drain regions in the semiconductor-substrate at both sides of the first gate electrode and the second gate electrode, respectively, first and second lightly doped source/drain regions in the semiconductor substrate, adjacent to the first heavily doped source/drain regions and the second heavily doped source/drain regions, respectively, wherein the first and second lightly doped source/drain regions have a different length, and a silicide layer on the first and second gate electrodes and in the first and second heavily doped source/drain regions.

In another aspect, a method for fabricating a semiconductor device according to the present invention comprises the steps of defining a peripheral area and a cell area in a semiconductor substrate to form a first and second gate electrodes in the peripheral area and the cell area, respectively, forming a first insulating spacer having a first length on both sides of the first gate electrode and on the semiconductor substrate, forming a second insulating spacer having a second length longer than the first length on both sides of the second gate electrode, forming first and second heavily doped source/drain regions in the semiconductor substrate at both sides of the first and second insulating spacers, forming a silicide layer on surfaces of the first and second heavily doped source/drain regions and the first and second gate electrodes, removing the first and second insulating spacers, and forming lightly doped source/drain regions in the semiconductor substrate corresponding to a portion where the first and second insulating spacers are removed.

In another aspect of the invention, a method for fabricating a semiconductor device comprises the steps of defining a peripheral area and a cell area in a semiconductor substrate, forming a first gate electrode and a second gate electrode on the cell area and the peripheral area, respectively, forming a first and a second insulating spacers over the first gate electrode and the second gate electrode, respectively, partially removing the first and the second insulating spacers so that the first insulating spacer has a first length, and the second insulating spacer has a second length longer than the length of the first insulating spacer, forming first and second heavily doped source/drain regions in the semiconductor substrate at both sides of the first and second insulating spacers, forming a silicide layer on surfaces of the first and second heavily doped source/drain regions and the first and second gate electrodes, removing the first and second insulating spacers, and forming lightly doped source/drain regions in the semiconductor substrate corresponding to a portion where the first and second insulating spacers are removed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF PREFERRED EMBODIMENTS

Reference will now be made in detail to the preferred, embodiments of the present invention, examples of which are illustrated in the accompanying drawings.

Figure 1:
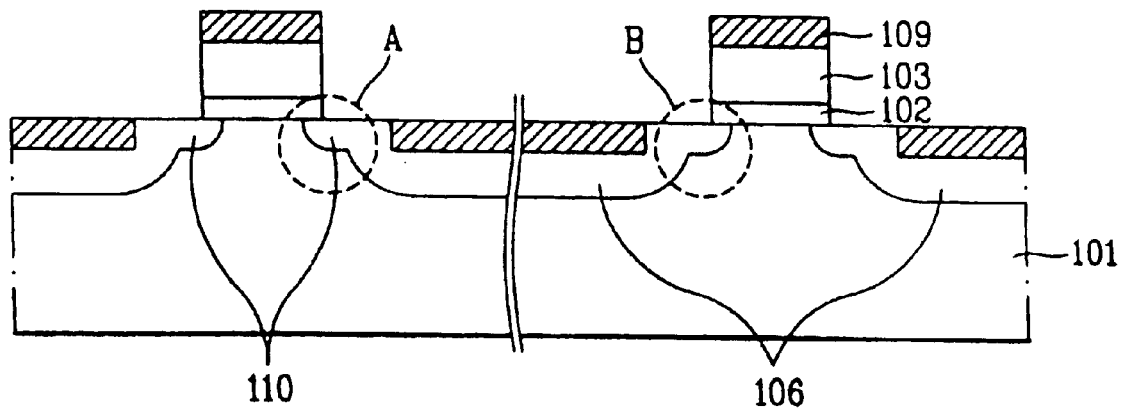
FIG. 1 is a cross-sectional view showing a related art semiconductor device.
Figure 2A:
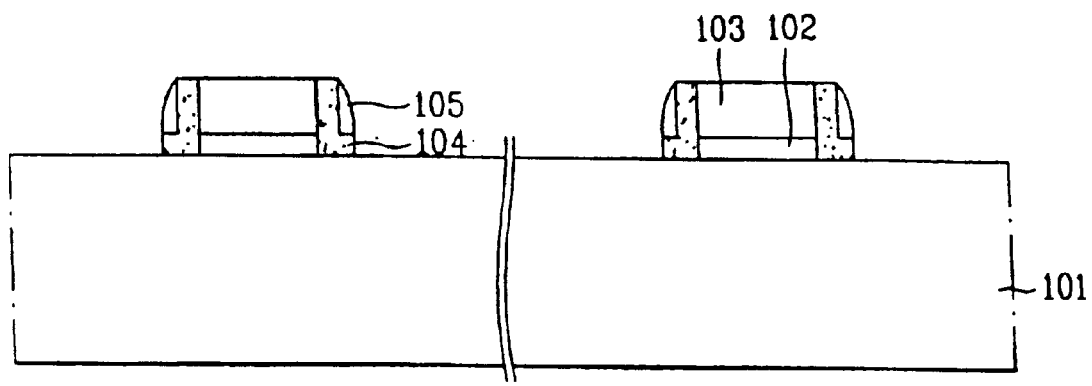
FIGS. 2A to 2D are cross-sectional views showing fabricating process steps of the related art semiconductor device.
Figure 2B:
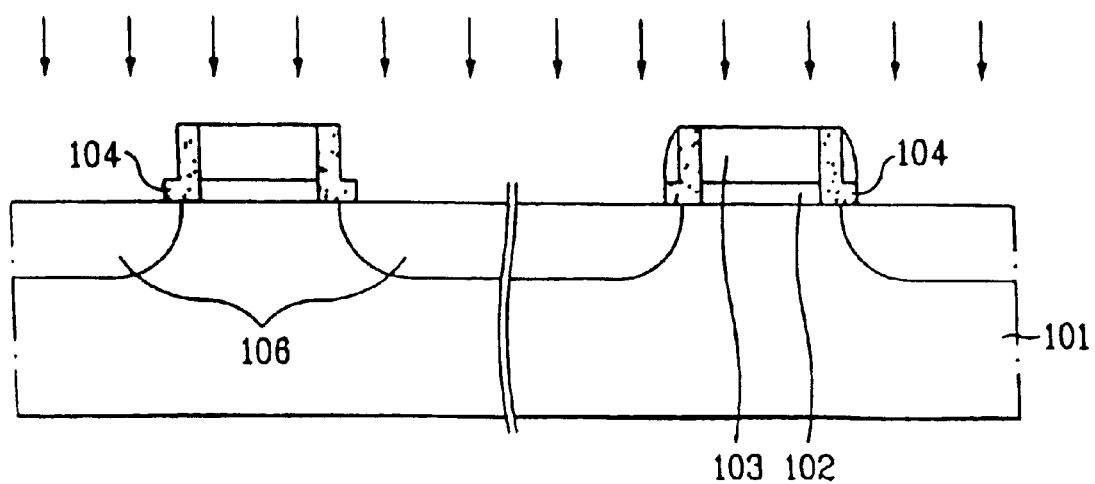
Figure 2C:
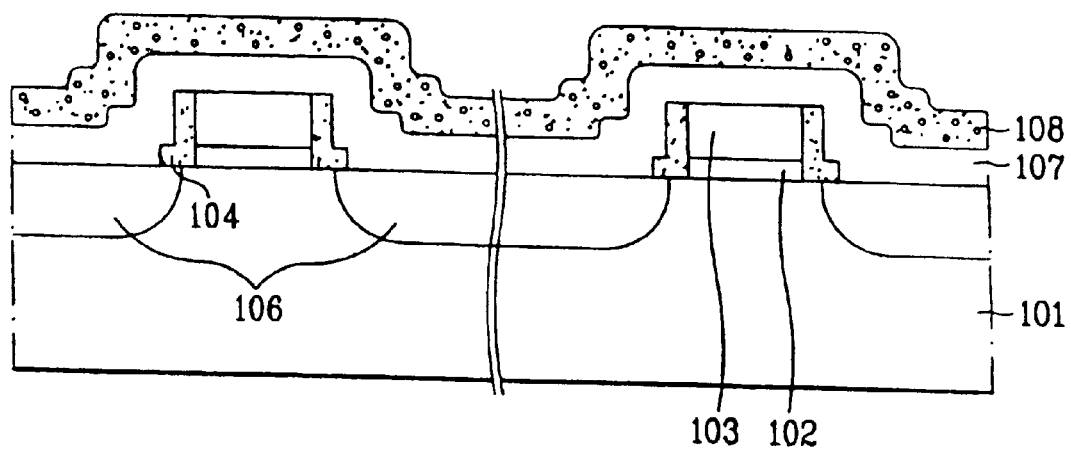
Figure 2D:
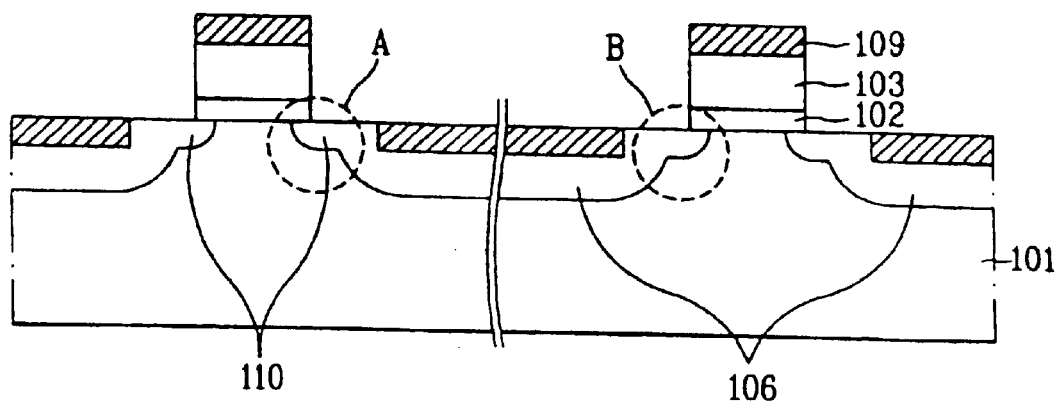
Figure 3:
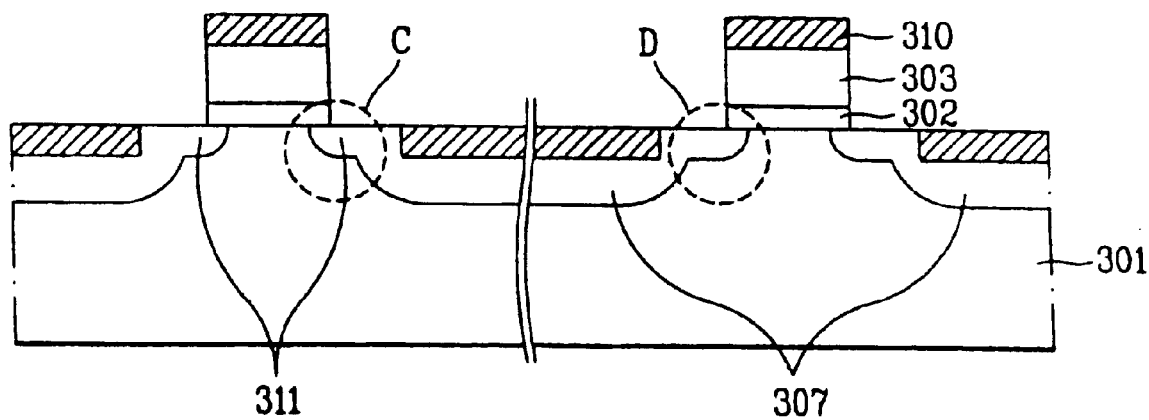
FIG. 3 is a cross-sectional view showing a semiconductor device according to an embodiment of the present invention.

As shown in FIG. 3, a cell area and a peripheral area are defined in a semiconductor substrate 301. A gate electrode 303 is formed over the semiconductor substrate 301 of the cell area and the peripheral area, and a gate oxide film 302 is interposed between the semiconductor 301 and the gate electrode 303.

Heavily doped source/drain regions 307 of the peripheral area are formed in the semiconductor substrate 301 at both sides of the gate electrode 303 and the gate oxide film 302 at a constant distance from the gate electrode 303 of the peripheral area. Lightly doped source/drain regions 311 are formed with predetermined depths in the semiconductor substrate 301 between the gate electrode 303 and the heavily doped source/drain regions 307 in the peripheral area and the cell area.

As shown in a portion C of FIG. 3, a length of the lightly doped source/drain regions 311 in the peripheral area is equal to each other.

As shown in a portion D of FIG. 3, heavily doped source/drain regions 307 of the cell area are formed in the semiconductor substrate 301 at both sides of the gate electrode 303 of the cell area at predetermined depths. A length of lightly doped source/drain regions 311 in the cell area is equal to each other. However, the length of the lightly doped source/drain regions 311 in the cell area as shown in the portion D is greater than the length of the lightly doped source/drain regions 311 in the peripheral area as shown in the portion C.

Afterwards, a cobalt silicide layer 310 is formed on surfaces of the gate electrode 303 and in the heavily doped source/drain regions 307 of both the cell and peripheral areas.

Now, a method for fabricating the aforementioned semiconductor device according to the present invention will be described with reference to FIGS. 4A to 4F.

In the drawings, left sides are cross-sectional views of a transistor formed in a peripheral area of an SRAM while right sides are cross-sectional views of a transistor formed in a cell area of the SRAM. The transistor of the cell area and the transistor of the peripheral area are formed at the same time.

Figure 4A:
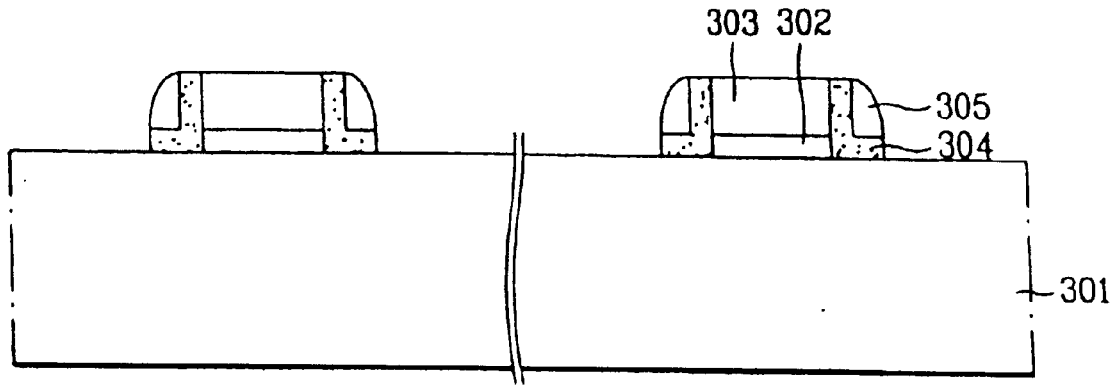
FIGS. 4A to 4F are cross-sectional views showing fabricating process steps of the semiconductor device according to the embodiment of the present invention.

As shown in FIG. 4A, the cell area and the peripheral area are defined in the semiconductor substrate 301 and the gate oxide film 302 is formed on the entire surface of the semiconductor substrate 301. Then, a polysilicon layer for forming the gate electrode 303 is deposited on the gate oxide film 302.

Afterwards, the polysilicon layer and the gate oxide film 302 are selectively removed by photolithography and etching processes to form the gate electrode 303 on the semiconductor substrate 301 of the cell area and the peripheral area.

A TiN layer is then deposited along the surfaces of the gate electrode 303 and the semiconductor substrate 301 by a CVD method. A silicon oxide ($SiO_2$) layer is deposited on the TiN layer.

The silicon oxide layer and the TiN layer are etched back to remain on both sides of the gate oxide film 302 and the gate electrode 303 and on the semiconductor substrate 301 adjacent to both sides, so that a nitride film spacer 304 and an insulating spacer 305 are formed thereon.

Figure 4B:
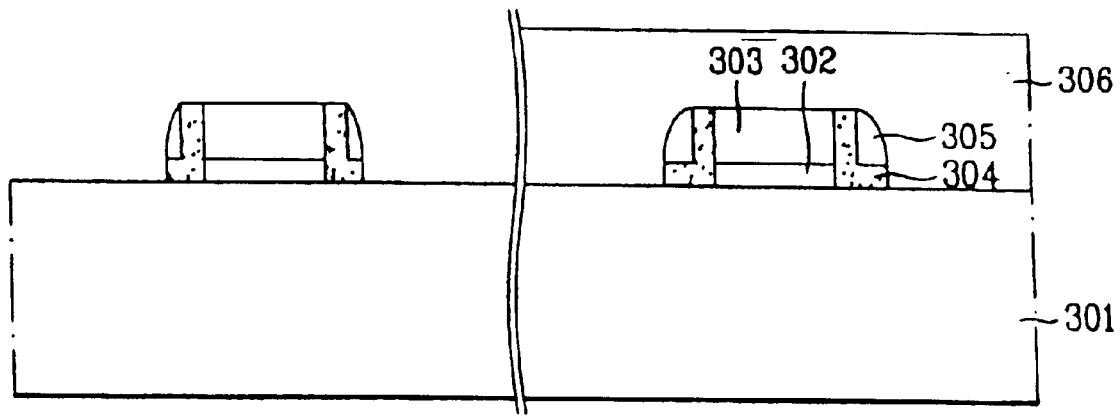

As shown in FIG. 4B, a photoresist 306 is deposited on the entire surface of the semiconductor substrate 301 and then patterned to remain on the semiconductor substrate 301 of the cell area by exposure and developing processes. The insulating spacer 305 and the nitride film spacer 304 are etched back using the patterned photoresist 306 as a mask to expose the semiconductor substrate 301 below both sides of the insulating spacer 305 and the nitride film spacer 304 in the peripheral area.

Figure 4C:
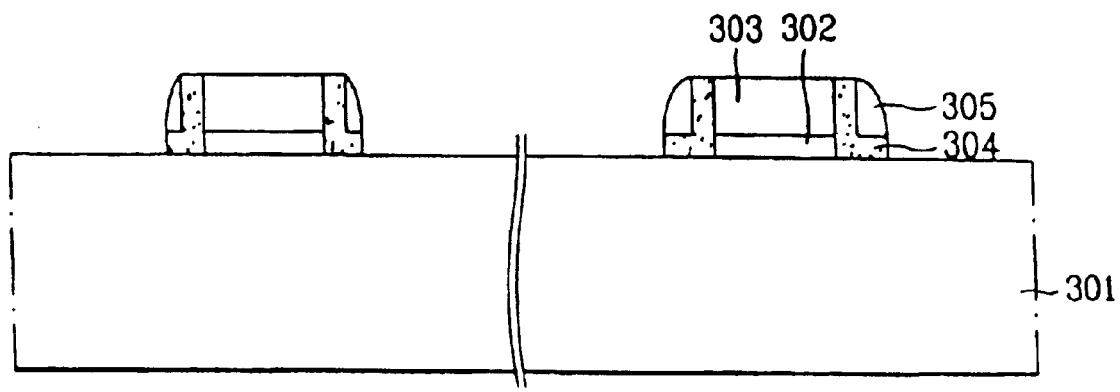

As shown in FIG. 4C, the photoresist 306 is removed.

Figure 4D:
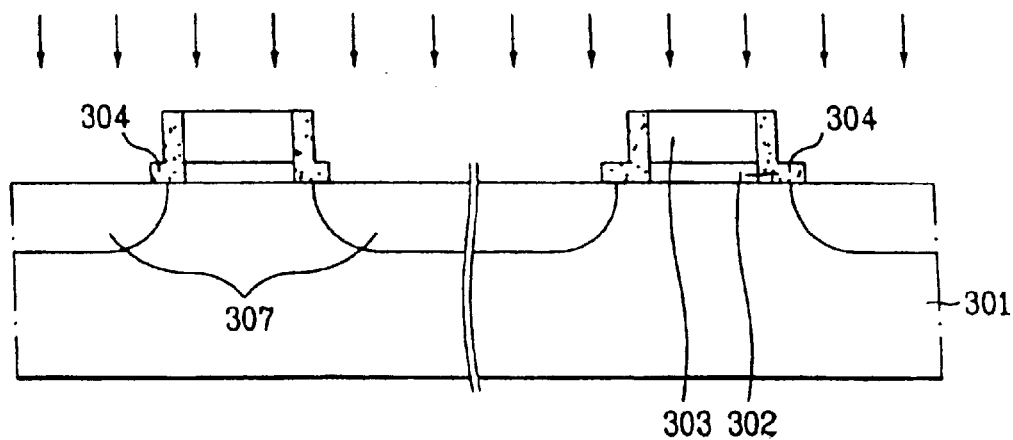

As shown in FIG. 4D, the insulating spacer 305 is removed and then impurity ions are injected into the entire surface of the semiconductor substrate 301 for heavy doping using the nitride film spacer 304 as a mask, so that the heavily doped source/drain regions 307 are formed in the semiconductor substrate 301 at both sides of the nitride film spacer 304.

At this time, the length of the nitride film spacer 304 in the cell area is longer than that in the peripheral area. Accordingly, the length of lightly doped source/drain region formed using the nitride film spacer 304 as a mask in the cell area is longer than that in the peripheral area, which will be defined in later process.

Figure 4E:
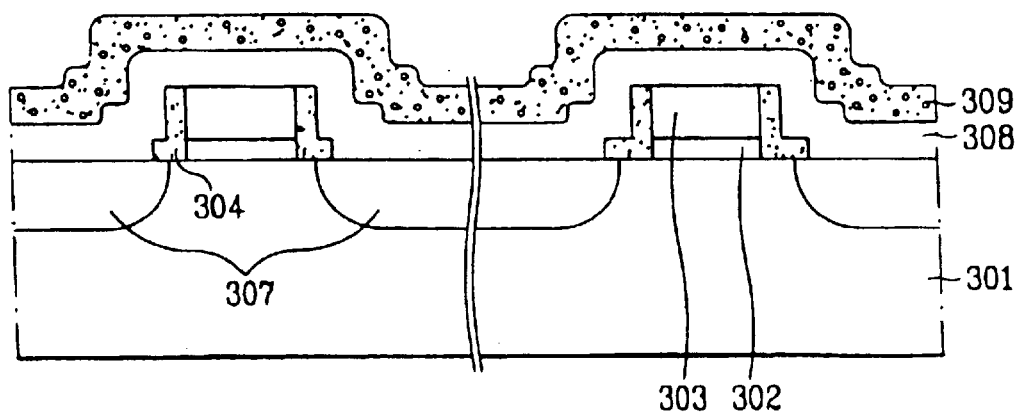

As shown in FIG. 4E, a cobalt layer 308 and a TiN layer 309 are sequentially deposited on the entire surface of the semiconductor substrate 301 including the gate electrode 303. At this time, instead of Co of the cobalt layer 308, any one of refractory metals such as W, Ti and Mo may be used.

Figure 4F:
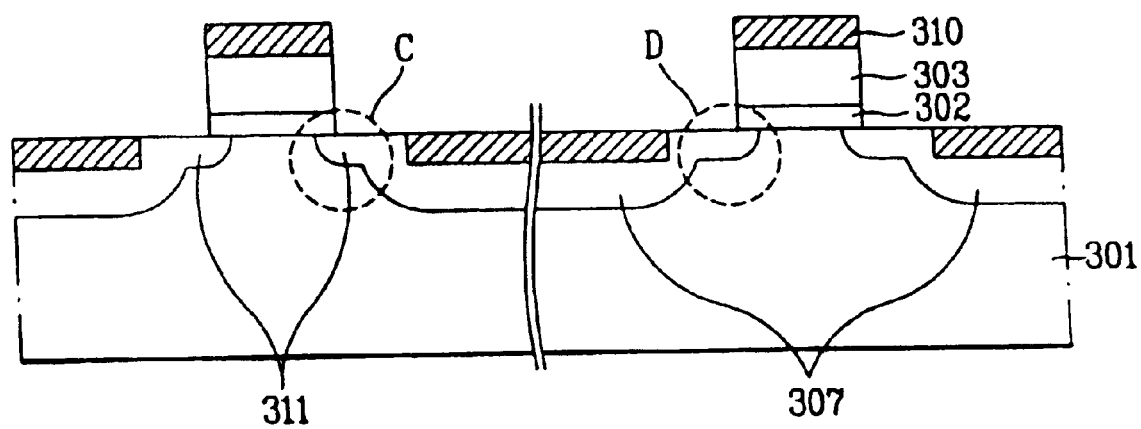

As shown in FIG. 4F, a cobalt silicide layer 310 is formed on the surfaces of the heavily doped source/drain regions 307 and the gate electrode 303 by a RTA process. The cobalt silicide layer 310 is formed by reacting silicon of the semiconductor substrate 301 in which the heavily doped source/drain regions 307 are formed, with the cobalt layer 308.

Afterwards, the TiN layer and the remaining cobalt layer 308 are removed and then a secondary RTA process is performed for stabilization of the cobalt silicide layer 310.

The nitride film spacer 304 is then removed. Subsequently, as shown in portions C and D of FIG. 4F, the lightly doped source/drain regions 311 having a longer length in the cell area than the peripheral area are formed in the semiconductor substrate 301 in which the cobalt silicide layer 310 is not formed, at both sides of the gate electrode 303 by injecting lightly doped impurity ions using the cobalt silicide layer 310 as a mask. Thus, the semiconductor device according to the embodiment of the present invention is completed.

As aforementioned, the semiconductor device and method for fabricating the same according to the present invention has the following advantages.

First, the length of the lightly doped impurity region can be freely controlled within the range that current specifications require, while a shallow junction is formed in the lightly doped impurity ion of the cell area. This improves characteristic of stand-by current. Furthermore, it improves characteristic of stand-by current of a low voltage SRAM without additional process by controlling the size of the insulating spacer of the transistor in the cell area and the peripheral area.

It will be apparent to those skilled in the art that various modifications and variations can be made in the semiconductor device and method for fabricating the same of the present invention without departing from the spirit or scope of the inventions. Thus, it is intended that the present invention covers the modifications and variations of this invention provided they come within the scope of the appended claims and their equivalents.

What is claimed is:

1. A method for fabricating a semiconductor device having cell and peripheral areas comprising the steps of:

forming a first and second gate electrodes in the peripheral area and the cell area, respectively;

forming a first insulating spacer having a first length on both sides of the first gate electrode in the peripheral area and on the semiconductor substrate adjacent to the both sides of the first gate electrode;

forming a second insulating spacer having a second length longer than the first length on both sides of the second gate electrode in the cell area and on the semiconductor substrate adjacent to the both sides of the second gate electrode;

forming first and second heavily doped source/drain regions in the semiconductor substrate at both sides of the first and second insulating spacers;

forming a silicide layer on surfaces of the first and second heavily doped source/drain regions and the first and second gate electrodes;

removing the first and second insulating spacers; and forming lightly doped source/drain regions having a longer length in the cell area than in the peripheral area by injecting impurity ions in the semiconductor substrate corresponding to portions where the first and second insulating spacers are removed.

2. The method of claim 1, herein the first and second insulating spacers are initially formed with the same length, and;

partially removing the first insulating spacers exposing the semiconductor substrate at both sides, thereby obtaining the first length.

3. The method of claim 1, wherein the first and second insulating spacers are titanium nitride.

4. The method of claim 1, wherein the first and second heavily doped source/drain regions are formed by injecting impurity ions using the first and second insulating spacers and the first and second gate electrodes as masks.

5. The method of claim 1, wherein the silicide layer is formed by depositing a metal on the semiconductor substrate and performing annealing.

6. The method of claim 1, wherein the silicide layer is formed of a material obtained by reacting silicon of the semiconductor substrate in which the first and second heavily doped source/drain regions are formed, with the metal.

7. The method of claim 1, further comprising the step of performing annealing to stabilize the silicide layer after removing the first and second insulating spacers.

8. The method of claim 1, wherein the lightly doped source/drain regions are formed by injecting lightly doped impurity ions using the silicide layer as a mask.

9. The method of claim 1, wherein the first and second heavily doped source/drain regions are deeper than the lightly doped source/drain regions.

10. The method of claim 1, wherein the first and second heavily doped source/drain regions and the lightly doped source/drain regions have the same conductivity types.

11. The method of claim 1, wherein the silicide layer is a metal silicide.

12. The method of claim 11, wherein the metal silicide is formed from a reaction of cobalt or refractory metal with silicon.

13. A method for fabricating a semiconductor device having peripheral and cell areas comprising the steps of:

forming a first gate electrode and a second gate electrode in the peripheral area and the cell area, respectively;

forming a first and a second insulating spacers over the first gate electrode and the second gate electrode, respectively;

partially removing the first insulating spacer, whereby the first insulating spacer becomes shorter than the second insulating spacer;

forming first and second heavily doped source/drain regions in the semiconductor substrate at both sides of the first and second insulating spacers;

forming a silicide layer on surfaces of the first and second heavily doped source/drain regions and the first and second gate electrodes;

removing the first and second insulating spacers; and forming lightly doped source/drain regions having a longer length in the cell area than in the peripheral area by injecting impurity ions in the semiconductor substrate corresponding to portions where the first and second insulating spacers are removed.

14. The method of claim 13, wherein the first and second insulating spacers are titanium nitride.

15. The method of claim 13, wherein the first and second heavily doped source/drain regions are formed by injecting impurity ions using the first and second insulating spacers and the first and second gate electrodes as masks.

16. The method of claim 13, wherein the silicide layer is formed by depositing a metal on the semiconductor substrate and performing annealing.

17. The method of claim 13, wherein the silicide layer is formed of a material obtained by reacting silicon of the semiconductor substrate in which the first and second heavily doped source/drain regions are formed, with the metal.

* * * * *